United States Patent [19]

Lu

[11] 3,860,429

[45] Jan. 14, 1975

[54] PHOTOPOLYMERIZATION OF ETHYLENICALLY UNSATURATED ORGANIC COMPOUNDS

[75] Inventor: Robert T. Lu, Wilmington, Del.

[73] Assignee: ICI America Inc., Wilmington, Del.

[22] Filed: Mar. 16, 1973

[21] Appl. No.: 341,854

[52] U.S. Cl. ................. 96/115 P, 96/35.1, 96/36.3, 96/33, 96/36.4, 204/159.14, 204/159.15, 204/159.23

[51] Int. Cl. ................................................ G03c 1/68

[58] Field of Search ........................ 96/115 P, 115 R; 204/159.14, 159.15, 159.23, 159.94

[56] References Cited

UNITED STATES PATENTS

| | | | |
|---|---|---|---|
| 3,090,664 | 5/1963 | Cline et al. | 204/159.15 |
| 3,183,094 | 5/1965 | Cerwonka et al. | 96/115 P |
| 3,374,160 | 3/1968 | Mao | 204/159.23 |
| 3,388,995 | 6/1968 | Schwerin et al. | 96/115 P |
| 3,511,687 | 5/1970 | Keyl et al. | 117/62 |
| 3,523,792 | 8/1970 | Delznne et al. | 96/115 P |
| 3,711,287 | 1/1973 | Mao | 96/115 P |
| 3,714,007 | 1/1973 | Borrel et al. | 156/272 |
| 3,715,211 | 2/1973 | Quaintance | 96/115 P |
| 3,715,293 | 2/1973 | Sandner et al. | 96/115 P |
| 3,782,961 | 1/1974 | Takahashi et al. | 204/159.15 |

OTHER PUBLICATIONS

Chemical Abstracts, Vol. 62, (1965), pp. 2825e, (Strohmeier et al.).

*Primary Examiner*—Norman G. Torchin
*Assistant Examiner*—J. P. Brammer

[57] ABSTRACT

The invention relates to the discovery that a combination of iron dodecacarbonyl and a co-catalyst selected from the group consisting of alpha-bromoisobutyrophenone, cumene, diisopropylbenzene, carbon tetrachloride, alkyl mercaptans containing from 10 to 16 carbon atoms, thiourea, organic peroxides, and mixtures thereof, and a combination of iron dodecacarbonyl, alpha-bromoacetophenone, and an organic peroxide are each capable of photosensitizing the polymerization of ethylenically unsaturated compounds with visible light in the range of 4,000 to 7,000 angstroms.

16 Claims, No Drawings

PHOTOPOLYMERIZATION OF ETHYLENICALLY UNSATURATED ORGANIC COMPOUNDS

BACKGROUND OF THE INVENTION

1. Field of the Invention

This invention relates to photosensitizing compositions, to photopolymerizable compositions, to polymerized products obtained therefrom, and to processes for the photopolymerization of ethylenically unsaturated compounds. More particularly, this invention relates to the discovery of a novel class of photosensitizing compositions which may be used to promote the photopolymerization of ethylenically unsaturated compounds in the presence of visible light.

2. Brief Description of the Prior Art

The polymerization of ethylenically unsaturated monomers with various compounds, such as peroxides and metal carbonyls, is known. See Bamford et al., proceedings of Chemical Society (1962), page 110, C.A. 57, 12690g, who disclose the polymerizations of methyl methacrylate at 100°C. with a metal carbonyl, such as iron carbonyl, dissolved in a halogen compound, such as carbon tetrachloride or chloroform. The photopolymerization of ethylenically unsaturated organic compounds by exposure to high intensity radiation, such as, ultra-violet rays, is also known in the prior art. It is also known that photopolymerization initiators, often referred to in the art as photosensitizers or photoinitiators, may be added to the ethylenically unsaturated organic compounds to accelerate their polymerization rate on exposure to high intensity radiation. See Strohmeir et al., Naturforfch 19b 882 (1964), C.A. 62, 2825e; U.S. Pat. Nos. 2,850,445 and 2,875,047; McCloskey et al., Industrial and Engineering Chemistry, October 1955, pages 2125–2129; and Bamford et al., proceedings of Royal Society (London), A284,455 (1965). U.S. Pat. Nos. 3,421,501; 3,450,612; 3,511,687; and German Pat. No. 1,297,269; each disclose curing unsaturated polyester-vinylidene monomer mixtures with ultra-violet light in the presence of a variety of photosensitizers. Illustrative examples of the photosensitizers disclosed in these patents are benzoin; 2,2′-dihydroxy-4,4′-dimethoxybenzophenone; 2,-4′-dihydroxydioxobenzophenone; and benzophenone. U.S. Pat. No. 3,450,614 discloses polymerizing an ethylenically unsaturated monomer onto a polyurethane with ultra-violet light and a photoinitiator such as benzophenone. U.S. Pat. No. 3,551,246 discloses the use of benzoin methyl ether and benzoin ethyl ether as photoinitiators for the curing of ethylenically unsaturated esters. Mochel et al., Journal of the American Chemical Society, Vol. 77, page 494 (1955) reports the use of benzoin methyl ether for the photopolymerization of methyl methacrylate. Kato et al., Bulletin Chemical Society of Japan, Vol. 37, page 1614 (1964) discloses the photopolymerization of methyl methacrylate with benzoin as a sensitizer. Gladgshev et al., Vysokomolekul Soedin, Vol. 5, page 700 (1963) discloses the photopolymerization of methyl methacrylate with biacetyl sensitizer. Tikahomolova et al., Zh. Prikl. Khim., Vol. 32, page 1874 (1959) reports the use of benzoin methyl ether, bromoacetophenone, and bromoisobutyrophenone as photoinitiators for the polymerization of methyl methacrylate. U.S. Pat. No. 3,374,160 discloses the polymerization of methyl methacrylate with ortho-bromoacetophenone as photoinitiator. Ozawa et al., Kobunski, Kagaku, Vol. 17, page 367 (1960) report the use of alpha-bromoacetophenone as a sensitizer for the photopolymerization of vinyl acetate with ultra-violet, electromagnetic radiation. Hungarian patent 152,859 discloses the use of a number of sensitizers, including benzoin and benzoin methyl ether, for the curing of unsaturated polyesters. U.S. Pat. No. 3,090,664 discloses copolymerizing a nitrogen-containing polymer with an ethylenically unsaturated monomer using ultra-violet light and a photoinitiator, such as biacetyl; benzil, 2,3-pentanedione; 2,3-octanedione; 1-phenyl-1,2-butanedione; 2,2-dimethyl-4-phenyl-3,4-butanedione; phenylglyoxal; diphenyltriketone; benzoin; and benzophenone. Belgian patent 54,118 discloses the curing of ethylenically unsaturated compounds with either methylene blue or an organic peroxide using ultraviolet light or a light source having a substantial ultra-violet component. A survey of photopolymerization initiators has been given by Delzenne in Industrie Chimique Belge, Vol. 24, pages 739–764 (1954). See also Kobunshi Kagaku (1971), 28 (315), 617–22 (Japan) (C.A. 76, 15001) and German Offen. 2,060, 873 (Plastics Manufacture and Processing, Vol. 75, page 13 (1971).

The photopolymerization initiators absorb light rays and, as a result, free radicals are formed which are capable of initiating polymerization. Although the photopolymerization initiators described in the prior art do accelerate the polymerization of ethylenically unsaturated compounds on exposure to high intensity radiation, the practical applications thereof have proven to be somewhat limited as the photopolymerization initiators proposed heretofore suffer from one or more substantial disadvantage which prevents their widespread application. For example, many of the sensitizers mentioned in the prior art cited above are difficult to obtain, reduce the "dark storability" of the monomer composition to such an extent that it is no longer possible to speak of stable single component systems, tend to cause discolorization of the cured polymers, and/or leave much to be desired in the way of effectiveness in promoting the polymerization of ethylenically unsaturated monomers. The major disadvantage of numerous photopolymerization initiators proposed in the prior art is that they require the use of ultra-violet radiation or at least the use of a light source which contains a substantial component thereof of ultra-violet radiation. Initiators proposed heretofore for use with visible light have not been sufficiently effective in promoting polymerization of the ethylenically unsaturated monomer. Another major disadvantage of many photopolymerization proposed heretofore is that they require the polymerization to take place in the absence of air since the oxygen in the air tends to inhibit photopolymerization, especially when the material to be polymerized is in the form of a thin film. Various methods of excluding oxygen have been proposed, but they have proven in practice to be too cumbersome and expensive to use. Accordingly, there is a great need in the art for an improved photopolymerization initiator which functions in the presence or absence of atmospheric oxygen, which does not require the presence of ultra-violet radiation and which sensitizes the photopolymerization of ethylenically unsaturated compounds on exposure to visible light rays having a wave length from 4,000 to 7,000 angstroms.

SUMMARY OF THE INVENTION

The present invention is directed to the unexpected discovery that a combination of iron dodecacarbonyl [$Fe_3(CO)_{12}$] and a co-catalyst selected from the group consisting of alpha-bromoisobutyrophenone, cumene, diisopropylbenzene, alkyl mercaptans containing from 10 to 16 carbon atoms, carbon tetrachloride, thiourea, organic peroxides, and mixtures thereof, and a combination of iron dodecacarbonyl, organic peroxide, and alpha-bromoacetophenone are each capable of photosensitizing the polymerization of ethylenically unsaturated compounds upon exposure to visible light rays having a wave length between 4,000 and 7,000 angstroms. Accordingly, the present invention provides photosensitizing compositions comprising iron dodecacarbonyl and a co-catalyst selected from the group consisting of alpha-bromoisobutyrophenone, cumene, diisopropylbenzene, carbon tetrachloride, alkyl mercaptans containing from 10 to 12 carbon atoms, thiourea, organic peroxides, and mixtures thereof and photosensitizing compositions comprising iron dodecacarbonyl, an organic peroxide and alpha-bromoacetophenone. The present invention also provides a photopolymerizable composition which is readily polymerized by exposure to visible light radiation and which composition comprises a mixture of at least one ethylenically unsaturated compound and a photosensitizing composition of this invention. There is also provided in accordance with the present invention a process for the photopolymerization of ethylenically unsaturated organic compounds which comprises irradiating a photopolymerizable composition comprising an ethylenically unsaturated organic compound, iron dodecacarbonyl, and a co-catalyst selected from the group consisting of alpha-bromoisobutyrophenone, cumene, diisopropylbenzene, alkyl mercaptans containing from 10 to 12 carbon atoms, carbon tetrachloride, thiourea, organic peroxides, mixtures thereof, or comprising an ethylenically unsaturated organic compound, iron dodecacarbonyl, organic peroxide and alpha-bromoacetophenone, with visible light of wave lengths ranging from 4,000 to 7,000 angstroms.

The photopolymerization compositions of this invention may be characterized in that, when subjected to visible light, they polymerize or harden to almost colorless, cured products. The polymerization is extremely rapid and may be carried out in the presence or absence of oxygen. A further advantage of the photopolymerizable compositions of this invention is that their storability in the dark is practically unlimited and they can, therefore, be used as stable single component systems.

DESCRIPTION OF PREFERRED EMBODIMENTS OF THE INVENTION

The amount of iron dodecacarbonyl, co-catalyst, and alpha-bromoacetophenone which may be employed in the photopolymerizable compositions of this invention are, of course, dependent upon many variables including the particular co-catalyst used, the wave length of light employed, the irradiation time, and the particular ethylenically unsaturated compound present. Generally, the amount of iron dodecacarbonyl employed is within the range of 0.05 to 5 percent by weight, and preferably from 0.1 to 2 percent by weight, and the amount of co-catalyst or alpha-bromoacetophenone employed is within the range of 0.1 to 5 percent by weight, and preferably from 0.5 to 2 percent by weight, all based on the weight of the ethylenically unsaturated photopolymerizable compound present in the initial composition. The weight ratio of co-catalyst or alpha-bromoacetophenone to iron dodecacarbonyl is generally from 0.2 to 10. It will be understood that the foregoing ranges are given for the purpose of aiding in the selection of the appropriate amount of photosensitizers which give an exceptionally good polymerization rate and are economical. It will be understood, of course, that smaller amounts may be employed if one is not particularly concerned about the polymerization rate and that larger amounts may be employed if one is not particularly concerned about the economics of the process. Accordingly, the amount of iron dodecacarbonyl, alpha-bromoacetophenone, and co-catalyst employed is generally from that amount which is sufficient to give a suitable polymerization rate up to that amount which makes the process uneconomical.

The organic peroxide which is employed in the photopolymerizable composition of this invention, either as a cocatalyst or in conjunction with alpha-bromoacetophenone, may be any peroxide which decomposes at temperatures from 25° to 172°C. to form free radicals. A preferred class of organic peroxides includes those which have a decomposition rate so that at least 50 percent of the peroxide decomposes to form free radicals in less than ten hours at temperatures of 25° to 172°C. Preferred organic peroxides for use in accordance with the present invention are lauroyl peroxide, benzoyl peroxide, and tertiary butyl peroxy pivalate. Illustrative examples of additional organic peroxides which may be employed include tertiary butyl perbenzoate; dicumyl peroxide; cumylbutyl peroxide; 2,4-dichlorobenzoyl peroxide; decanoyl peroxide; caprylyl peroxide; propionyl peroxide, acetyl peroxide; p-chlorobenzoyl peroxide; t-butyl peroxyisobutyrate; hydroxyheptyl peroxide; cyclohexanone peroxides; 2,5-dimethylhexyl-2,5-di-(peroxybenzoate); t-butyl peracetate; di-t-butyl diperphthalate; methyl ethyl ketone peroxides; 2,5-dimethyl-2,5-di-(t-butyl peroxy)hexane; t-butyl hydroperoxide; di-t-butyl peroxide; 2,5-dimethyl-2,5-di-(t-butyl peroxy)hexyne-3; p-methane hydroperoxide; 2,5-dimethyl hexyl-2,5-dihydroperoxide; cumene hydroperoxide; and succinic acid peroxide. Mixtures of organic peroxides may also be used. The use of an organic peroxide as co-catalyst in conjunction with iron dodecacarbonyl is particularly advantageous when the photopolymerizable composition is in the form of a thick laminate.

The ethylenically unsaturated polymerizable compounds which may be polymerized in accordance with the present invention include any ethylenically unsaturated compound which is capable of free radical polymerization, including monomers, dimers, trimers, oligomers, prepolymers, and mixtures thereof. Illustrative examples of ethylenically unsaturated compounds which may be employed in the photopolymerizable compositions of this invention include: unsaturated acids such as acrylic acid, methacrylic acid, itaconic acid, and ethacrylic acid; esters of an ethylenically unsaturated acid and a saturated or ethylenically unsaturated alcohol; esters of ethylenically unsaturated alcohols and saturated acids; vinylidene compounds including styrene, acrylonitrile, methyl methacrylate, diethylaminoethyl methacrylate, and methacrylonitrile; unsaturated polyurethanes; polyethers; and polyesters. Additional compounds include acrylic acid and methacrylic acid esters of methanol, isopropanol, propanol, butanol, isobutanol, ethylene glycol, triethylene glycol, tetraethylene glycol, tetramethylene glycol, trimethylol ethane and trimethylol propane. A particularly preferred ethylenically unsaturated composition which may be cured in accordance with the present invention comprises a solution of an ethylenically unsaturated polyester dissolved in an ethylenically unsaturated copolymerizable monomer.

Ethylenically unsaturated polyesters may be prepared by reacting an ethylenically unsaturated dicarboxylic acid with a polyol. A preferred class of polyesters are substantially free of aromatic hydroxyl groups. Illustrative examples of polyols include ethylene glycol, diethylene glycol, propane glycol, propane diol, butane diol, hexane diol, trimethylol propane, pentaerythritol alkylene oxide ethers of these alcohols, and alkylene oxide ethers of the following dihydric phenols: 2,2-bis (4-hydroxyphenyl)propane; bis(4-hydroxyphenyl)methane; 2,2-bis (3-methyl-4-hydroxyphenyl)butane; 4,4'-dihydroxybiphenol; hydrogenated 2,2'-bis(4-hydroxyphenyl)propane; 2,4-dihydroxybenzophenone; 4,4'-dihydroxydiphenyl ether; 4,4'-dihydroxydiphenyl sulfone; 4,4'-dihydroxydiphenyl ketone; hydroquinone; and resorcinol.

A preferred class of polyoxyalkylene ethers of dihydric phenols which may be used to form the polyester compositions of this invention are those represented by the general formula:

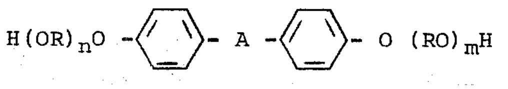

wherein $n$ and $m$ are integers and the sum of $n$ and $m$ is from 2 to 20, A is an alkylene radical having from one to four carbon atoms, and R is an alkylene radical having from two to four carbon atoms. Polyoxyalkylene ether diols corresponding to the above formula and the preparation thereof are disclosed in U.S. Pat. No. 2,331,265, the disclosure of which is hereby incorporated herein by reference.

Illustrative examples of unsaturated dicarboxylic acids and anhydrides which may be used to form the polyester compositions include maleic acid, fumaric acid, and maleic anhydride.

The polyester compositions which may be employed according to this invention may also be prepared by the reaction of a polyol and a mixture of ethylenically unsaturated dicarboxylic acid and saturated dicarboxylic acid, such as adipic acid, phthalic acid, and isophthalic acid, provided that only at least about 50 percent of the dicarboxylic acid moieties of the polyester composition be contributed by an ethylenically unsaturated dicarboxylic acid. A more detailed description of the polyesters which may be used in accordance with this invention may be found in U.S. Pat. No. 2,634,251 and U.S. Pat. No. 3,214,491, the disclosure of which are incorporated hereinto by reference.

Illustrative examples of the numerous ethylenically unsaturated copolymerizable monomers which may be used to form the polyester solutions include vinylidene monomers such as styrene, vinyl toluene, chlorostyrene, divinylbenzene, diallyl phthalate, acrylonitrile, methyl methacrylate, vinyl acetate, ethyl acrylate, vinyl pyridine, and 2-ethylhexyl acrylate. Two preferred classes of ethylenically unsaturated copolymerizable monomers are vinyl monomers and vinylidene monomers. A preferred ethylenically unsaturated monomer is styrene.

The photopolymerizable compositions of this invention are stable and may be stored for long periods of time without gelation, provided they are stored in the absence of light and at temperatures sufficiently low to prevent thermal decomposition of the co-catalyst compound. Although the stability of the photopolymerizable compositions of this invention are excellent, the storage stability thereof may be increased by including in the photopolymerizable composition any of the known polymerization inhibitors, for example, para-benzoquinone, 2,5-ditertiarybutylquinone, tertiarybutyl pyrocatechol, hydroquinone, 3-methyl pyrocatechol, 4-ethyl pyrocatechol, and copper naphthenate.

When the photopolymerizable compositions of this invention are exposed to visible light rays having a wave length from 4,000 and 7,000 angstroms, the photopolymerizable compositions, after a brief induction period, are rapidly polymerized. While the use of ultraviolet radiation is not necessary in order to obtain the rapid photopolymerization of the above-described compositions, the presence of ultra-violet rays are not injurious to the photopolymerization of the above-described compounds. Accordingly, the photopolymerization process of this invention may be carried out by merely exposing the above described photopolymerizable compositions to only visible light rays or to a mixture of visible and ultra-violet light.

In carrying out the photopolymerization process of this invention, there is no need to exclude the presence of oxygen as the presence of oxygen does not interfere with the photopolymerization of ethylenically unsaturated compounds when they are sensitizied with a photosensitizing composition of this invention. However, oxygen may be excluded if desired.

The rate at which the photopolymerizable compositions will cure is determined by several variables including the specific ingredients in the photopolymerizable composition, the concentration of the photoinitiators employed, thickness of the material, nature and intensity of the radiation source and its distance from the photopolymerizable composition, and the temperature of the surrounding atmosphere. When the photopolymerizable composition is in the form of a thin film, for example, thickness of from 0.5 to 150 microns, the cure time will vary from a few seconds to a few minutes; whereas, when the photopolymerizable composition is in the form of a thick laminate or molded article, the cure time may vary from several seconds to an hour or more.

Suitable light sources include carbon arcs, mercury and vapor lamps, fluorescent lamps, argon glow lamps, photographic flood lamps, tungsten lamps, and ordinary daylight. A preferred source of radiation may be obtained from a 1-kilowatt tungsten filament lamp. Distances of the light source from the photopolymerizable composition is generally from about ¼ to 10 inches, and preferably from about 3 to 6 inches.

The photopolymerization reaction of this invention may be carried out according to any of the well-known processes, such as bulk, emulsion, suspension, and solution polymerization processes. The only requirement is that the sensitizer combination of metal carbonyl complex and co-catalyst be brought into intimate contact with the photopolymerizable composition so as to facilitate the generation of free radicals therein when exposed to visible light rays.

The photopolymerizable compositions of this invention may include chain transfer agents. Illustrative examples of transfer agents include the mercaptans and derivatives thereof, such as, glycol mercaptoacetate, and ethyl mercaptoacetate; tertiary aliphatic amines, such as, triethanolamine and tertiary butyl diethanolamine; morpholine; n-aminomorpholine; and cyclicized unsaturated hydrocarbons, such as, neohexene, cyclohexene, cyclooctene, and mixtures thereof. The amount of transfer agent employed may vary from 0.5 to 20 percent by weight of the total composition.

In addition to the above-described ingredients, the compositions of the present invention may contain additional agents including stabilizers, dyes, pigments, plasticizers, lubricants, glass fibers, and other modifiers which are conventional in the art to obtaining certain desired characteristics in the finished products.

The photopolymerizable compositions of the present invention are suitable as adhesives, particularly for use in the laminating art; as coatings for matals, plastics, textiles, paper, and glass; as markers for roads, parking lots, airfields, and similar surfaces; as vehicles for printing inks, lacquers, and paints; and in the preparation of photopolymerizable elements, for example, a support having disposed thereon a photopolymerizable layer of a composition as described herein.

The photopolymerizable compositions of this invention are particularly useful in the preparation of printing plates and photographic etching resists which can be further used as planographic printing plates, as matrixes for printing matter, as screens for silk screen printing, and as photoresists for etching. The photopolymerizable composition is spread upon a surface, such as a surface of metal, and a design is printed thereon photographically by exposure to light through a suitable image pattern. The light induces polymerization in the exposed area of the photopolymerizable composition whereby the polymeric layer is rendered insoluble in the solvent or solvents used for applying the photopolymerizable layer. Thereafter, the non-exposed areas are washed away with solvent for the monomeric material.

In the production of molded articles with the photopolymerizable compositions, it is especially advantageous that the composition may be hardened by appropriately measured irradiation, without any notable external heat supply, so that almost crack-free molded articles may be formed. If necessary, the hardening process may be interrupted by removing the light source and the hardening process terminated with the intermediate production of prepolymers. These prepolymers are stable when stored in the dark. The photopolymerization process may be initiated again by exposure of the prepolymers to light.

When a photopolymerizable composition of the present invention is used in the form of a laminate, for example, as an adhesive between two adjacent layers, at least one of the layers must be translucent to visible light. As mentioned above, the addition of organic peroxides to the photopolymerizable composition is particularly preferred when the compositions are used to form laminates. Typical laminations include cellophane to cellophane films, treated polyethylene to treated polyethylene films, and Mylar to a metal substrate.

In order that those skilled in the art may better understand how the present invention may be practiced, the following examples are given. These examples are set forth solely for the purpose of illustration and any specific enumeration of details contained therein should not be interpreted as expressing limitations of this invention. All parts and percentages are by weight unless otherwise stated.

Examples 1 through 7 show the polymerization of methyl methacrylate using various combinations of sensitizing compositions of this invention. The procedure employed is as follows: Into a 5 inch Pyrex test tube is placed 0.05 grams of $Fe_3(CO)_{12}$, 10 grams of methyl methacrylate, and 0.1 grams of the indicated co-catalyst. The solutions are thoroughly mixed and illuminated with visible light from a 1,000 watt tungsten filament lamp at a distance of 6 inches. The solution is illuminated without degassing or flushing with nitrogen. The solutions are illuminated for 45 to 60 minutes. The formation of polymethyl methacrylate is observed in each case. The composition of the photopolymerization initiator employed is shown in the following Table I.

TABLE I

| Example Number | Co-Catalyst |
|---|---|
| 1 | 1% t-butyl peroxy pivalate |
| 2 | 1% alpha-bromoisobutyrophenone |
| 3 | 1% alpha-bromoisobutyrophenone<br>1% t-butyl peroxy pivalate<br>1% alpha-bromoacetophenone |
| 4 | 1% t-butyl peroxy pivalate |
| 5 | 1% carbon tetrachloride |
| 6 | 1% carbon tetrachloride<br>1% t-butyl peroxy pivalate |
| 7 | 1% cumene |

Examples 8 through 13 show the use of the various photopolymerization initiators of this invention for curing polyester castings. The following procedure is used in these examples. ⅛ inch castings are prepared in a conventional plate glass mold from a solution of equal parts styrene and polyoxypropylene(2.2) 2,2-bis(4-hydroxyphenyl)propane which has been sensitized with 0.5% of $Fe_3(CO)_{12}$ and 1 percent of each of the indicated co-catalysts. tungsten filament lamp. The castings are placed 6 inches from the light source. The samples are then removed from the light source and the Barcol hardness of the cured products determined. The particular photopolymerization initiator composition employed and the results obtained are shown in the following Table II.

TABLE II

| Example Number | Co-Catalyst | Time of Illumination (minutes) | Barcol Hardness |
|---|---|---|---|
| 8 | 1% CTC<br>1% TBPP | 30 | 37–42 |
| 9 | 1% BAP<br>1% TBPP | 25 | 37–41 |
| 10 | 1% BIBP<br>1% TBPP | 30 | 20–29 |
| 11 | 1% BIBP | 30 | — |
| 12 | 1% Cumene<br>1% TBPP | 25 | 35–38 |

TABLE II-Continued

| Example Number | Co-Catalyst | Time of Illumination (minutes) | Barcol Hardness |
|---|---|---|---|
| 13 | 1% TBPP | 30 | 36–40 |

CTC = carbon tetrachloride
TBPP = t-butyl peroxy pivalate
BAP = alpha-bromoacetophenone
BIBP = alpha-bromoisobutyrophenone Examples 14 through 20 are given to illustrate the polymerization of various ethylenically unsaturated compositions with the photosensitizers of the present invention. The following procedure is used in Examples 14 through 20. Into a 5 inch Pyrex test tube are placed 0.05 grams of $Fe_3(CO)_{12}$, 10 grams of the indicated unsaturated compound, and 0.1 gram of the indicated co-catalyst. The solution is thoroughly mixed and illuminated with visible light from a 1,000 watt tungsten filament lamp. The solution is illuminated without degassing or flushing with nitrogen and the sample is placed 6 inches away from the light source. The sample is illuminated with the visible light for 60 minutes. Each of the samples is found to contain polymer of the indicated unsaturated compound. The particular unsaturated compound and co-catalyst used are shown in the following Table III.

TABLE III

| Example Number | Unsaturated Compound | Co-Catalyst |
|---|---|---|
| 14 | Acrylic acid | Thiourea |
| 15 | Vinyl acetate | Dodecyl mercaptan |
| 16 | Styrene | Diisopropyl benzene |
| 17 | (1) | Alpha-bromoisobutyrophenone |
| 18 | Acrylamide | Alpha-bromoacetophenone and benzoyl peroxide |
| 19 | (1) | Carbon tetrachloride |
| 20 | (1) | Cumene |

(1) Solution of equal parts of styrene and polyoxypropylene (2.2) 2,2-bis(4-hydroxyphenyl)propane Although this invention has been described with reference to specific photosensitizing compositions and ethylenically unsaturated polymerizable compounds and to the specific reaction conditions, it will be appreciated that numerous other ethylenically unsaturated compounds and photosensitizing compositions, may be substituted for those specifically described and that the particular reaction conditions employed may be modified, all within the spirit and scope of this invention.

Having thus described the invention, what is desired to be secured by Letters Patent is:

1. A photosensitizing composition selected from the group consisting of a blend of $Fe_3(CO)_{12}$ and a co-catalyst selected from the group consisting of alpha-bromoisobutyrophenone, cumene, carbon tetrachloride, diisopropyl benzene, alkyl mercaptans containing from 10 to 16 carbon atoms, thiourea, organic peroxides, and mixtures thereof and a blend of $Fe_3(CO)_{12}$, organic peroxide, alphabromoacetophenone, wherein the weight ratio of co-catalyst or alpha-bromoacetophenone to iron dodecacarbonyl is from 0.2 to 10.

2. A photopolymerizable composition comprising an ethylenically unsaturated compound and a photosensitizing composition of claim 1, wherein the amount of iron dodecacarbonyl present is from 0.05 to 5% by weight, based on the weight of ethylenically unsaturated compound, and the amount of co-catalyst or alpha-bromoacetophenone present is from 0.1 to 5 percent by weight, based on the weight of ethylenically unsaturated compound.

3. A photopolymerizable composition of claim 2 wherein the photosensitizing composition is a mixture of $Fe_3(CO)_{12}$, an organic peroxide and a co-catalyst selected from the group consisting of alpha-bromoacetophenone, alpha-bromoisobutyrophenone, carbon tetrachloride, cumene, diisopropylbenzene, an alkyl mercaptan containing from 10 to 16 carbon atoms, thiourea and mixtures thereof.

4. A photopolymerizable composition of claim 2 wherein the ethylenically unsaturated compound comprises a solution of an ethylenically unsaturated polyester in an ethylenically unsaturated monomer.

5. A process for the photopolymerization of ethylenically unsaturated organic compounds which comprises irradiating a composition of claim 2 with light having a wave length from 4,000 to 7,000 angstroms.

6. A process for the photopolymerization of ethylenically unsaturated organic compounds which comprises irradiating a composition of claim 4 with light having a wave length of from 4,000 to 7,000 angstroms.

7. A product produced by the process of claim 6.

8. A product produced by the process of claim 5.

9. A photopolymerizable composition of claim 2 comprising an ethylenically unsaturated compound, an organic peroxide, $Fe_3(CO)_{12}$, and alpha-bromoacetophenone.

10. A photopolymerizable composition of claim 2 comprising an ethylenically unsaturated compound, $Fe_3(CO)_{12}$, and alpha-bromoisobutyrophenone.

11. A photopolymerizable composition of claim 2 comprising an ethylenically unsaturated compound, $Fe_3(CO)_{12}$, and cumene.

12. A photopolymerizable composition of claim 2 comprising an ethylenically unsaturated compound, $Fe_3(CO)_{12}$, and carbon tetrachloride.

13. A photopolymerizable composition of claim 2 comprising an ethylenically unsaturated compound, $Fe_3(CO)_{12}$, and diisopropyl benzene.

14. A photopolymerizable composition of claim 2 comprising an ethylenically unsaturated compound, $Fe_3(CO)_{12}$, and an alkyl mercaptan containing from 10 to 16 carbon atoms.

15. A photopolymerizable composition of claim 2 comprising an ethylenically unsaturated compound, $Fe_3(CO)_{12}$, and thiourea.

16. A photopolymerizable composition of claim 2 comprising an ethylenically unsaturated compound, $Fe_3(CO)_{12}$, and organic peroxide.

* * * * *